(12) United States Patent
Baba et al.

(10) Patent No.: US 6,229,832 B1
(45) Date of Patent: May 8, 2001

(54) OPTICAL WAVELENGTH STABILITY CONTROL APPARATUS, OPTICAL TRANSMITTER AND MULTIPLE WAVELENGTH TRANSMITTER

(75) Inventors: Naohiko Baba, Fujisawa; Hideyuki Serizawa, Ueda; Akihiro Hayami; Tadashi Hatano, both of Yokohama; Yasuhiro Yamada, Fujisawa; Norio Chujo, Tokyo-to, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/188,364

(22) Filed: Nov. 10, 1998

(30) Foreign Application Priority Data

Nov. 27, 1997 (JP) .................................... 9-326341

(51) Int. Cl.[7] ................. H01S 3/00; H01S 3/13
(52) U.S. Cl. .................... 372/38.01; 372/29.02; 372/29.011; 372/38.02; 372/33
(58) Field of Search ............ 372/29.02, 29.011, 372/38.02, 33

(56) References Cited

U.S. PATENT DOCUMENTS 5,299,212 * 3/1994 Koch et al. ..................... 372/32
5,408,483 * 4/1995 Kasai et al. ..................... 372/31
5,684,590 * 11/1997 sanders et al. ................. 356/350
6,018,536 * 1/2000 Alphonse ....................... 372/23

FOREIGN PATENT DOCUMENTS

| 57-186383 | 11/1982 | (JP) . |
| 6-283797 | 10/1994 | (JP) . |
| 11126940 | * 5/1999 | (JP) . |
| 2000151011 | * 5/2000 | (JP) . |

* cited by examiner

Primary Examiner—Frank G. Font
Assistant Examiner—Armando Rodriguez
(74) Attorney, Agent, or Firm—Mattingly, Stanger & Malur, P.C.

(57) ABSTRACT

An optical transmitter includes a plurality of optical wavelength stability control apparatuses, each of which is capable of compensating for a wavelength drift by varying a laser diode drive current. Each of the optical wavelength stability control apparatuses detects a laser diode drive current, which is controlled by an auto power control circuit, by using a laser diode drive current detector. The laser diode drive current is normalized by a laser diode drive current increase/decrease normalization unit. A laser diode temperature control target value is generated at a compensated reference voltage generator, in response to the normalized laser diode drive current, to control a current value applied to a thermoelectric cooler so that an output value of a temperature monitor circuit approaches a predetermined laser diode temperature control target value.

20 Claims, 6 Drawing Sheets

OPTICAL WAVELENGTH STABILITY CONTROL APPARATUS, OPTICAL TRANSMITTER AND MULTIPLE WAVELENGTH TRANSMITTER

BACKGROUND OF THE INVENTION

1. Field of the Invention

The present invention relates to an optical wavelength stability control apparatus for stabilizing an optical wavelength output from a laser diode (hereinafter, LD). In particular, the present invention relates to an optical wavelength stability control apparatus suitable for an optical multiple wavelength transmission.

2. Description of the Related Art

Due to the development of an advanced information society, an optical communication system to which an optical signal is transmitted by using an optical fiber requires an enlarged transmission capacity. The optical multiple wavelength transmission is implemented to realize an increase in transmission capacity. A plurality of channels are transmitted through a common transmission path by assigning respective signals to different optical wavelengths. The precision stabilization of the optical wavelength within ±0.2 nm has long been required so that adjacent wavelengths do not interfere with each other.

Figure 2:
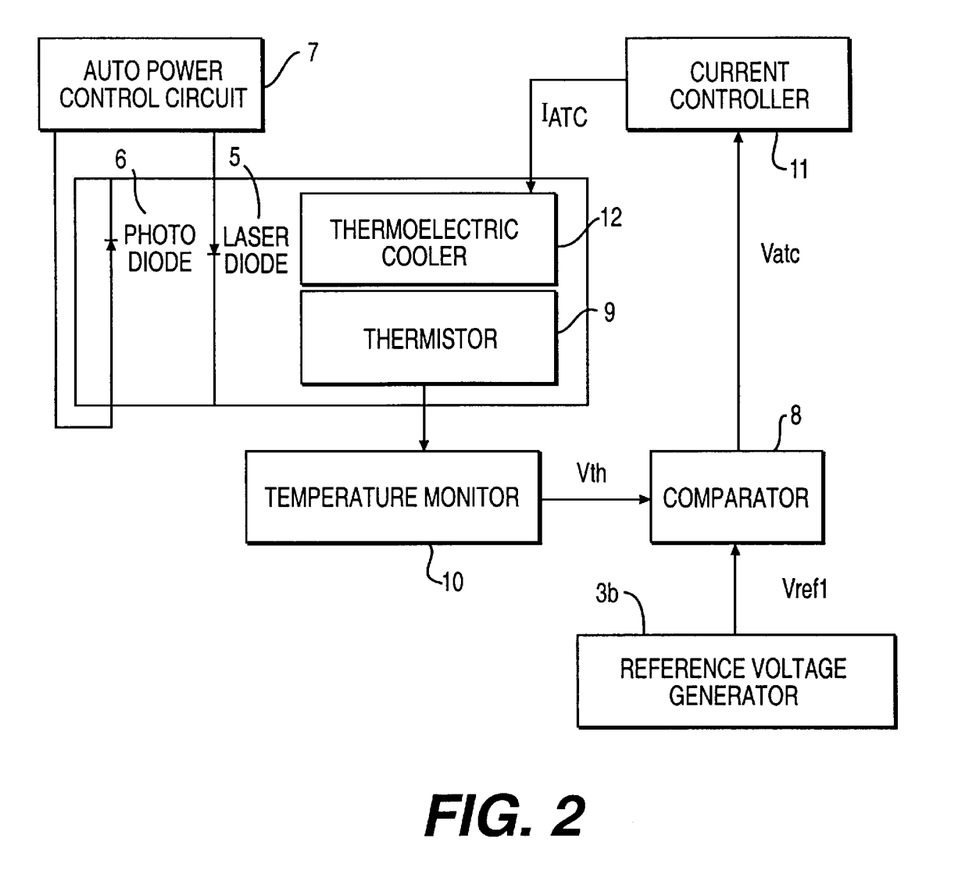
FIG. 2 illustrates the inventors analysis of a conventional optical wavelength stabilization control apparatus.

FIG. 2 illustrates a conventional apparatus for optical wavelength stabilization. In general, it is known that a temperature fluctuation as well as a drive current fluctuation of a semiconductor laser cause a fluctuation of the optical transmitter. FIG. 2 illustrates an apparatus used for stabilizing an optical wavelength by keeping the temperature of a semiconductor laser 5 constant. A temperature monitor 10 detects the temperature of LD using a thermistor 9 and a reference voltage generator 3b outputs a reference temperature voltage which is a target value for controlling a temperature. An output voltage (Vth) of the temperature monitor 10 and an output voltage (Vref1) of the reference voltage generator 3b are compared at a comparator 8, and the difference between Vth and Vref1 is calculated. In a current controller 11, the stabilization of the optical wavelength is done by determining a drive current value of a thermoelectric cooler 12 so that an output value at the comparator 8 becomes zero. A semiconductor laser apparatus described in a Japanese laid-open patent No 57-186383 also employs the same method.

However, the electric power consumption (an input electric power to the semiconductor laser) required to obtain the identical optical power output gradually increases over time with the age of a semiconductor laser. Thus, the temperature at an active layer of the semiconductor laser rises and thereby causes an optical wavelength to fluctuate.

Japanese laid open patent 6-283797 describes a control method for keeping an optical power output and the temperature of the active layer constant. According to this method the temperature of a heat sink is controlled to negate a temperature rise of the active layer caused by an increase of the electric power consumption to gain an identical optical power with respect to an age related change of the semiconductor laser. Based upon this control, the temperature of the laser can be constantly controlled for a long period of time.

Figure 3:
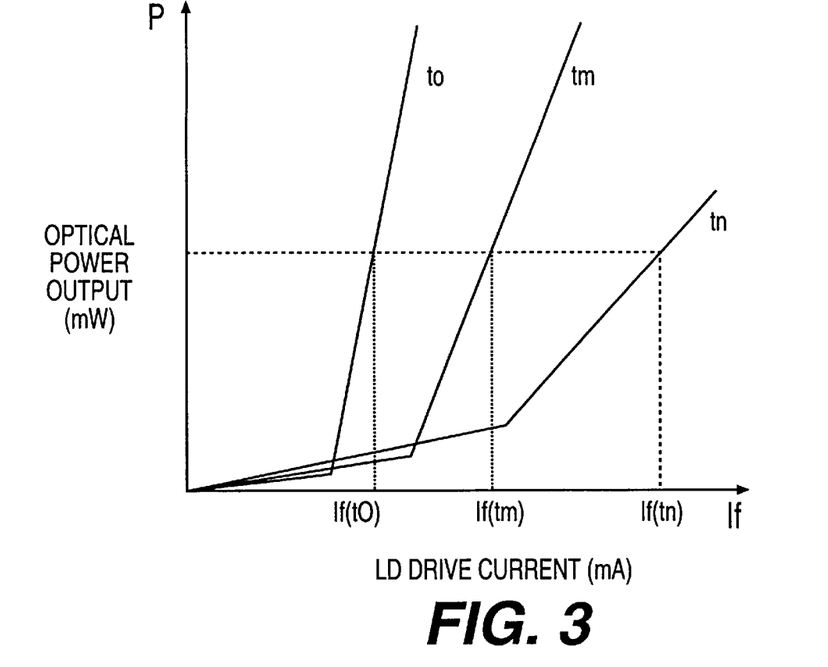
FIG. 3 is a graph showing the relation between the characteristics of an electrical/optical conversion and time for the LD.
Figure 4:
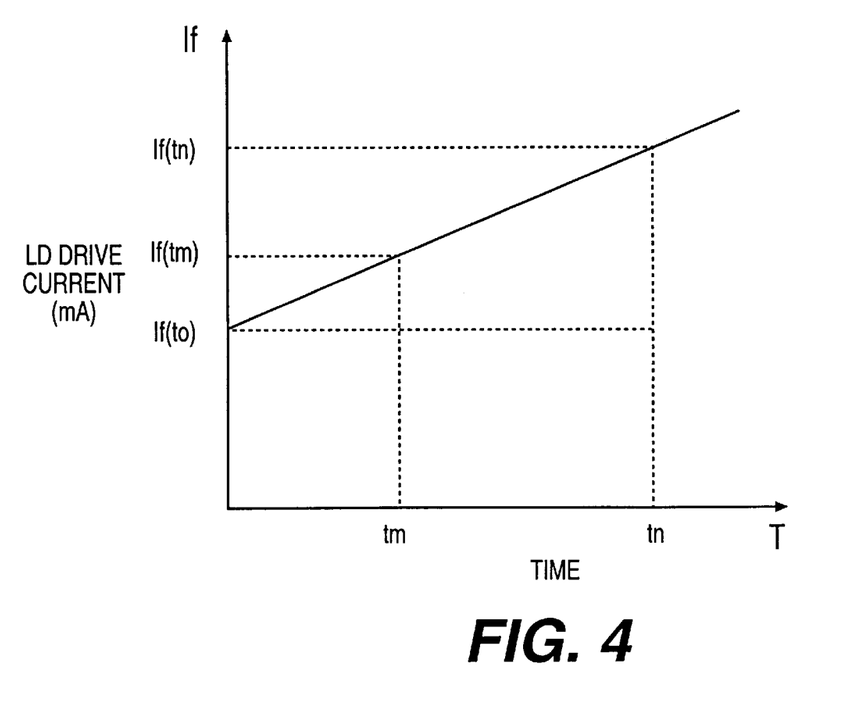
FIG. 4 is a graph showing the relation between the LD drive current and time for compensating the deterioration of the LD.
Figure 5:
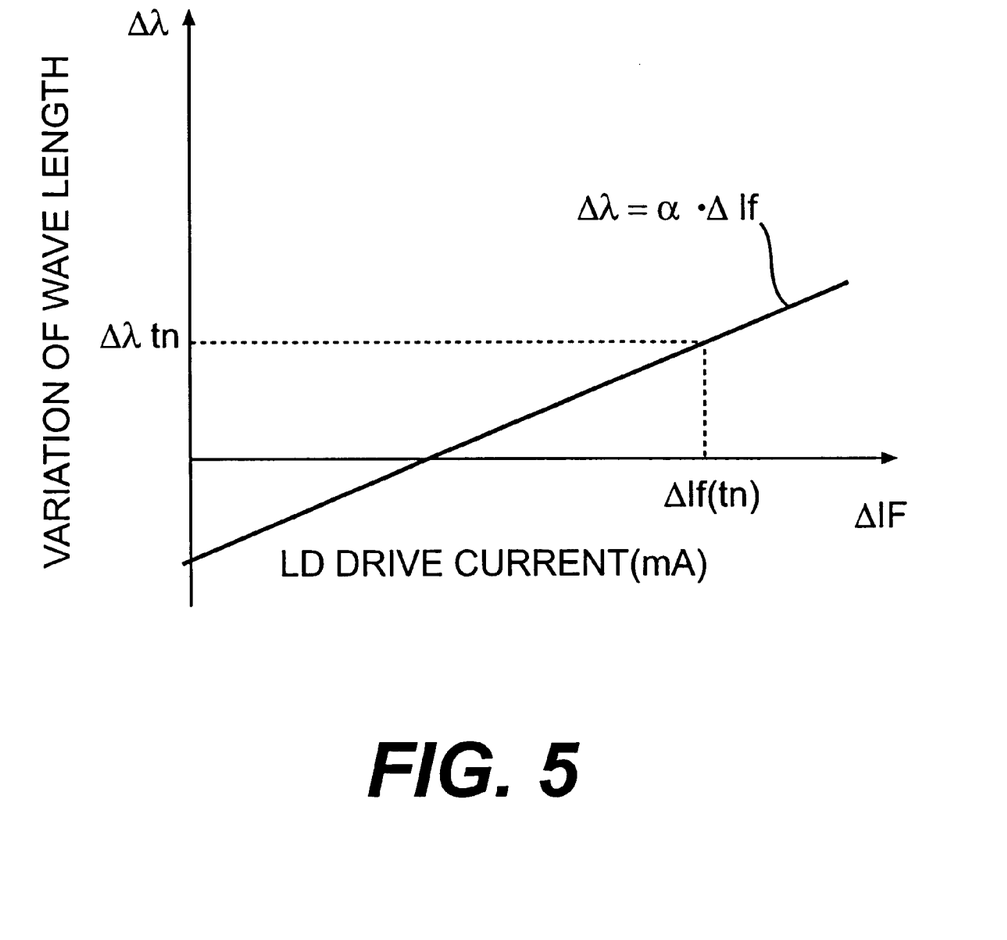
FIG. 5 is a graph showing the relation between a drive current and a quantity of the wavelength drift for the LD.

However, even if the temperature of the laser could be made constant, there is a problem that the optical wavelength of the laser changes in accordance with the fluctuation of the drive current when it is varied. In other words, as shown in FIG. 3, efficiency decreases with the age of the LD. To compensate for this deterioration, the LD drive current is controlled by an auto power control circuit (hereinafter, APC) so that the optical output of the LD becomes constant. Therefore, as shown in FIG. 4, the LD drive current value If (t) increases. The relation between optical wavelength and LD drive current is shown in FIG. 5.

Then, the fluctuation of the LD drive current causes fluctuation of the wavelength. A timing chart of an operation and a wavelength fluctuation in the conventional art is shown in FIGS. 6(a)–6(d).

Figure 6A:
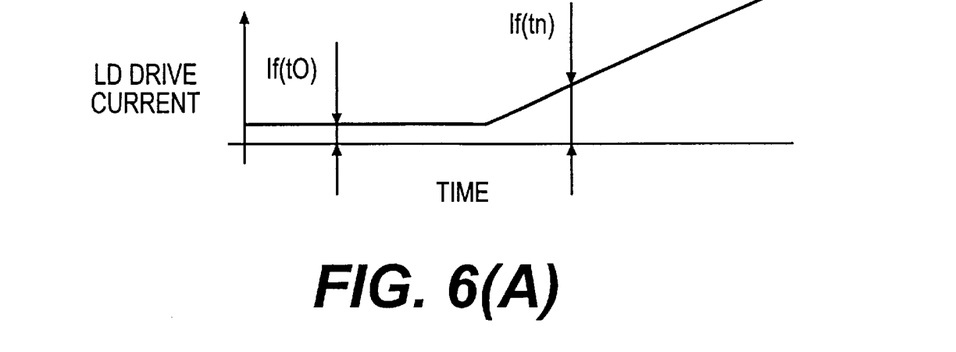
Figure 6B:
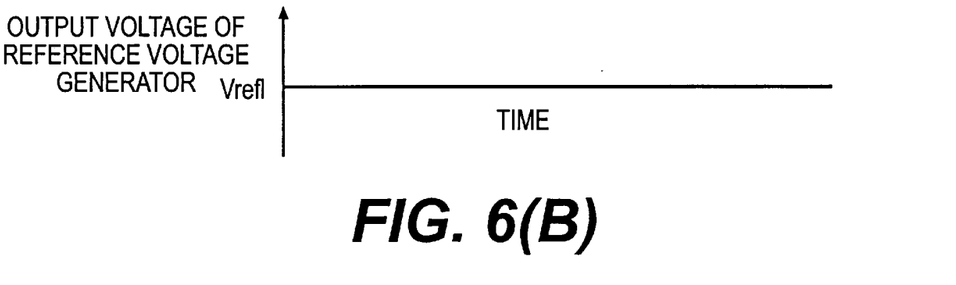
Figure 6C:
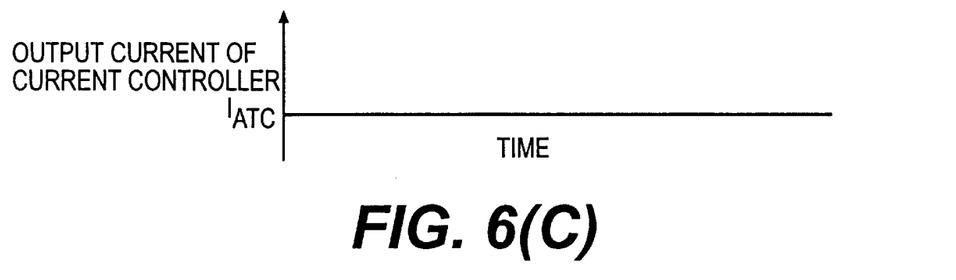
Figure 6D:
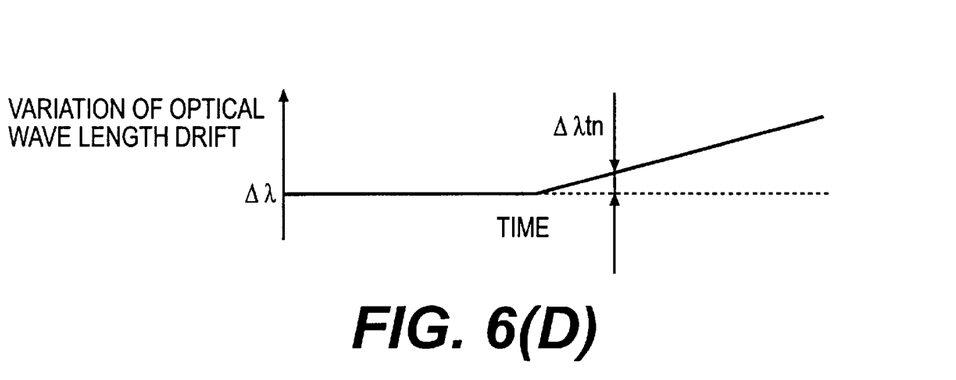

When the LD drive current If (t) fluctuates with respect to an aging deterioration as shown in FIG. 6(a), a quantity of the wavelength fluctuation increases and the fluctuation cannot be compensated because a reference voltage (Vref1) is a fixed value as shown in FIG. 6(b).

The above-mentioned characteristics are explained using the following equations. A quantity of the wavelength drift ($\Delta\lambda 1$) causing an increase/decrease of the LD drive current is given as equation 1.

$$\Delta\lambda 1 = \alpha \cdot \{If(tn) - If(t0)\} \tag{1}$$

where $\alpha$ = Drive current-wavelength fluctuation conversion constant, $If(t0)$ = Drive current value at initial time t0, and $If(tn)$ = Drive current after passing time tn.

On the other hand, a quantity of the wavelength drift ($\Delta\lambda 2$) caused by a control loop error of a current controller is given as equation 2.

$$\Delta\lambda 2 = (1/G) \cdot Vatc \cdot \beta \cdot \gamma \tag{2}$$

where

G = Feedback loop gain,

Vatc = Normalization portion output voltage value, $\beta$ = Temperature of the laser—Wavelength conversion constant, and $\gamma$ = Temperature in a circuit—Voltage conversion constant.

Accordingly, a quantity of the wavelength drift ($\Delta\lambda$) in the optical wavelength stability control method of the conventional art is given as equation 3.

$$\Delta\lambda = \Delta\lambda 1 + \Delta\lambda 2 = \alpha \cdot \{If(tn) - If(t0)\} + (1/G) \cdot Vatc \cdot \beta \cdot \gamma \tag{3}$$

Equation 4 is obtained from a feedback stability condition.

$$Vatc = G \cdot (Vth - Vref1) \tag{4}$$

where

Vth = Temperature monitor output (LD temperature), and

Vref = Reference voltage generator output (initial set temperature).

When the equation 4 is substituted into the equation 3, $\Delta\lambda$ is given as equation 5.

$$\Delta\lambda = \alpha \cdot \{If(tn) - If(t0)\} + (Vth - Vref1) \cdot \beta \cdot \gamma \tag{5}$$

From the equation 5, it is confirmed that it is impossible to compensate the wavelength drift $\alpha \cdot \{If(tn) - If(t0)\}$ causing an increase/decrease of the LD drive current, even though the thermal detection voltage Vth and the reference voltage Vref 1 can be controlled.

SUMMARY OF THE INVENTION

An object of the present invention is to provide an optical wavelength stability control apparatus for stabilizing the wavelength precisely by compensating for the wavelength drift over a long period of time.

Figure 1:
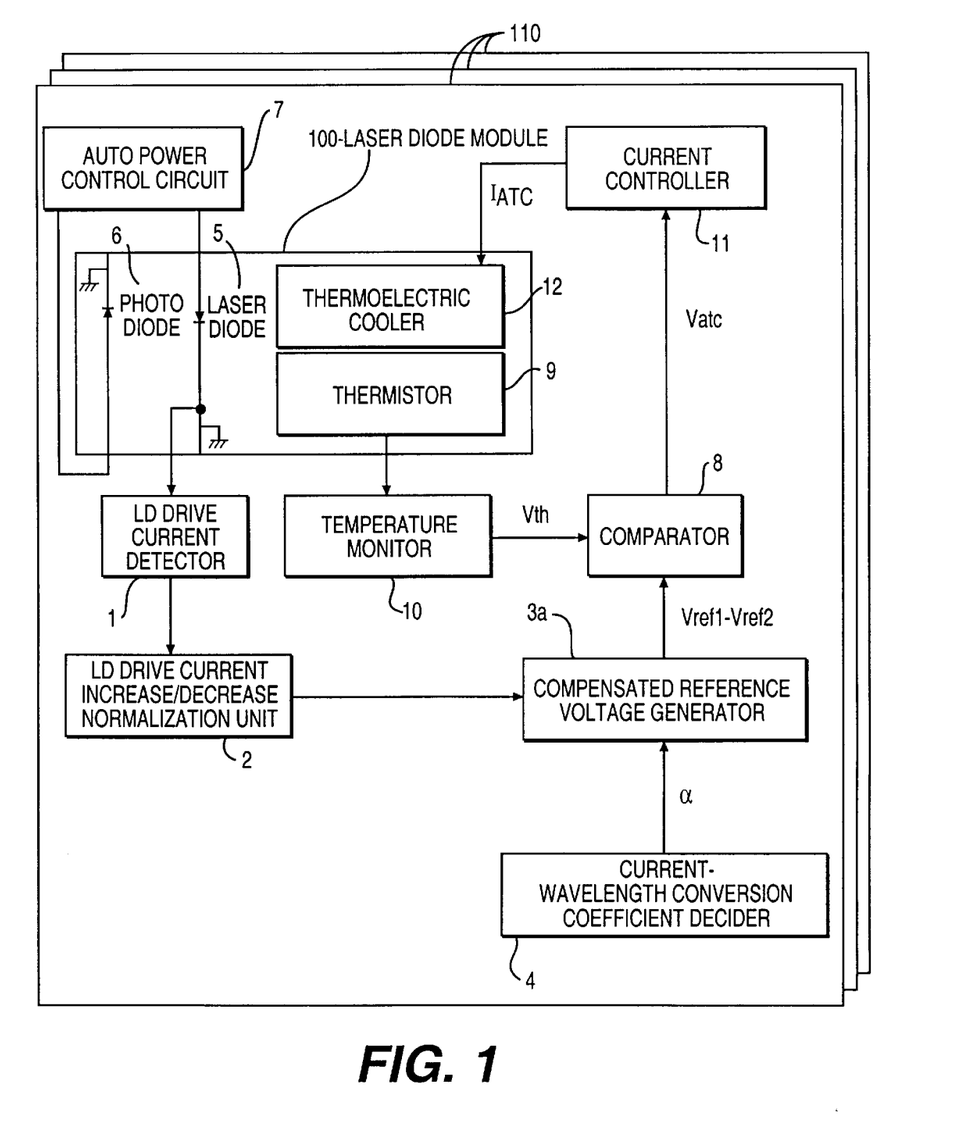
FIG. 1 illustrates an optical wavelength stability control apparatus based upon the present invention.

An object of the present invention is to provide an optical wavelength stability control apparatus for stabilizing the optical wavelength output from a LD. This apparatus includes a current detector for detecting the LD drive current driving the LD, and a thermal controller including a compensated reference voltage generator 3a, a comparator 8, a thermistor 9, a temperature monitor 10, a current controller 11 and a thermoelectric cooler 12, for controlling a temperature of the LD to be a control target value. The thermal controller includes a reference generator means for setting the control target value in response to the LD drive current detected by the current detector.

Another object of the present invention is to provide an optical transmitter including a plurality of optical wavelength stability control apparatus, each of the optical wavelength stability control apparatus including a laser diode module having the LD, a photo-diode (hereinafter, PD), a thermoelectric cooler and a thermistor built-in. The apparatus includes an APC capable of controlling the stability of the optical power output by varying the LD drive current driving the LD, a LD drive current detector for detecting the LD drive current,
  a LD drive current increase/decrease normalization unit for outputting the increased or decreased LD drive current value being normalized, based upon the detected LD drive current value,
  a compensated reference voltage generator for generating the LD temperature control target value in response to an increase or a decrease of the LD drive current value being normalized,
  a temperature monitor circuit for detecting a temperature of the LD based on the thermistor,
  a comparator for detecting a difference between the detected LD temperature value and the LD temperature control target value,
  a current controller for determining a current value applied to the thermoelectric cooler so that a value detected by the comparator becomes zero, and
  a thermoelectric cooler for applying to the thermoelectric cooler a current value determined by the current controller.

Yet another object of the present invention is to provide a method for stabilizing an optical wavelength output from a LD using a leading discharge at a diode connection portion. The method encompasses detecting a fluctuation of a drive current driving a LD and regulating a temperature at a diode connection portion to compensate the fluctuation of an optical wavelength along with a variation of the LD drive current.

Still another object is to provide an optical multiple wavelength transmitter for transmitting light having a plurality of different wavelengths. The transmitter includes a plurality of optical wavelength stability control apparatus, each of which includes:

a LD,
  a current detector for detecting respectively the drive current driving the LD, and
  means for controlling respectively the temperature of the LD,
  wherein the means for controlling includes a temperature detection means for detecting respectively the temperature of the LD, a cooling means for cooling respectively the LD and a control means for setting respectively a control target temperature for the respective LD using a conversion coefficient predetermined for the respective LD in response to the variation of the detected drive current and controlling the cooling means to regulate the detected respectively the temperature of the LD to a set control target value.

Alternatively, the transmitter may include a plurality of laser diode modules and a common current detector and a common means for controlling the temperatures of the laser diodes.

These and other objects, features and advantages of the present invention will be readily apparent in view of the following detailed description of the preferred embodiments in conjunction with the drawings.

BRIEF DESCRIPTION OF THE DRAWINGS

FIGS. 6(A)–6(D) are timing charts showing wavelength drift that occurs in the prior art.

DETAILED DESCRIPTION OF THE PREFERRED EMBODIMENTS

A description will be given of the embodiments of the present invention by reference to the accompanying drawings.

FIG. 1 shows an example of a plurality of optical wavelength stability control apparatuses 110 used in an optical transmitter. Each of the apparatus includes a laser diode module 100 having a LD 5, a PD 6, a thermoelectric cooler 12 and a thermistor 9, a APC 7, a LD drive current detector 1, a LD drive current increase/decrease normalization unit 2, a compensated reference voltage generator 3a, a current-wavelength conversion coefficient decider 4, a comparator 8, a temperature monitor 10 and a current controller 11. A plurality of such apparatuses are used to form the optical transmitter. Each of the apparatuses has a LD outputting a respective optical wavelength. While FIG. 1 illustrates an embodiment where each apparatus 110 is provided with a plurality of elements as shown, according to another embodiment, the transmitter may only have a plurality of laser diode modules, while the remaining elements are commonly provided.

A thermal controller controls the temperature of the laser diode to be a control target value. According to the disclosed embodiment, the thermal controller includes thermoelectric cooler 12, thermistor 9, temperature monitor 10, comparator 8, compensated reference voltage generator 3a, current-wavelength conversion coefficient decider 4 and current controller 11. Of course, numerous variations could be made to the thermal controller shown in order to achieve the same objective of controlling temperature based upon measured laser diode current.

The PD 6 is used to detect an intensity of an optical power from the LD.

A thermoelectric cooler 12 is used to cool the LD 5 by discharging heat from the LD 5 to outside of the laser diode module 100. On the other hand, the thermoelectric cooler 12 transfers heat in the reverse direction, thereby causing the LD 5 to absorb heat from outside of the module 100.

A portion of light outputted from the LD 5 is branched to the PD 6 and an intensity of the optical power is detected. The APC 7 controls the drive current value so that the power output value detected by the PD 6 becomes a constant. The detected power output is proportional to the optical output power of the LD 5 because the optical power output is branched at a constant ratio. Accordingly, the optical output power from the LD 5 is stabilized by controlling the drive current value.

The LD drive current increase/decrease normalization unit 2 normalizes a deviation of the drive current from an initial value, and outputs such deviation as a standard value. This standard value is input to the compensated reference voltage generator 3a.

The compensated reference voltage generator 3a generates a temperature setting value correcting an optical wavelength drift due to deterioration caused by aging of the LD, based upon an input standard value and a current-wavelength conversion coefficient α input from a current-wavelength conversion coefficient decider 4. The temperature setting value (Vatc) is output to the comparator 8.

The comparator 8 detects a difference between the temperature setting value from the compensated reference voltage generator 3a and a temperature of the LD detected by the thermistor 9.

The current controller 11 determines the current value for driving the thermoelectric cooler 12 so that the difference detected by the comparator 8 becomes small (even zero, for example) thereby controlling the stability of an optical wavelength of the LD 5.

Figure 7:
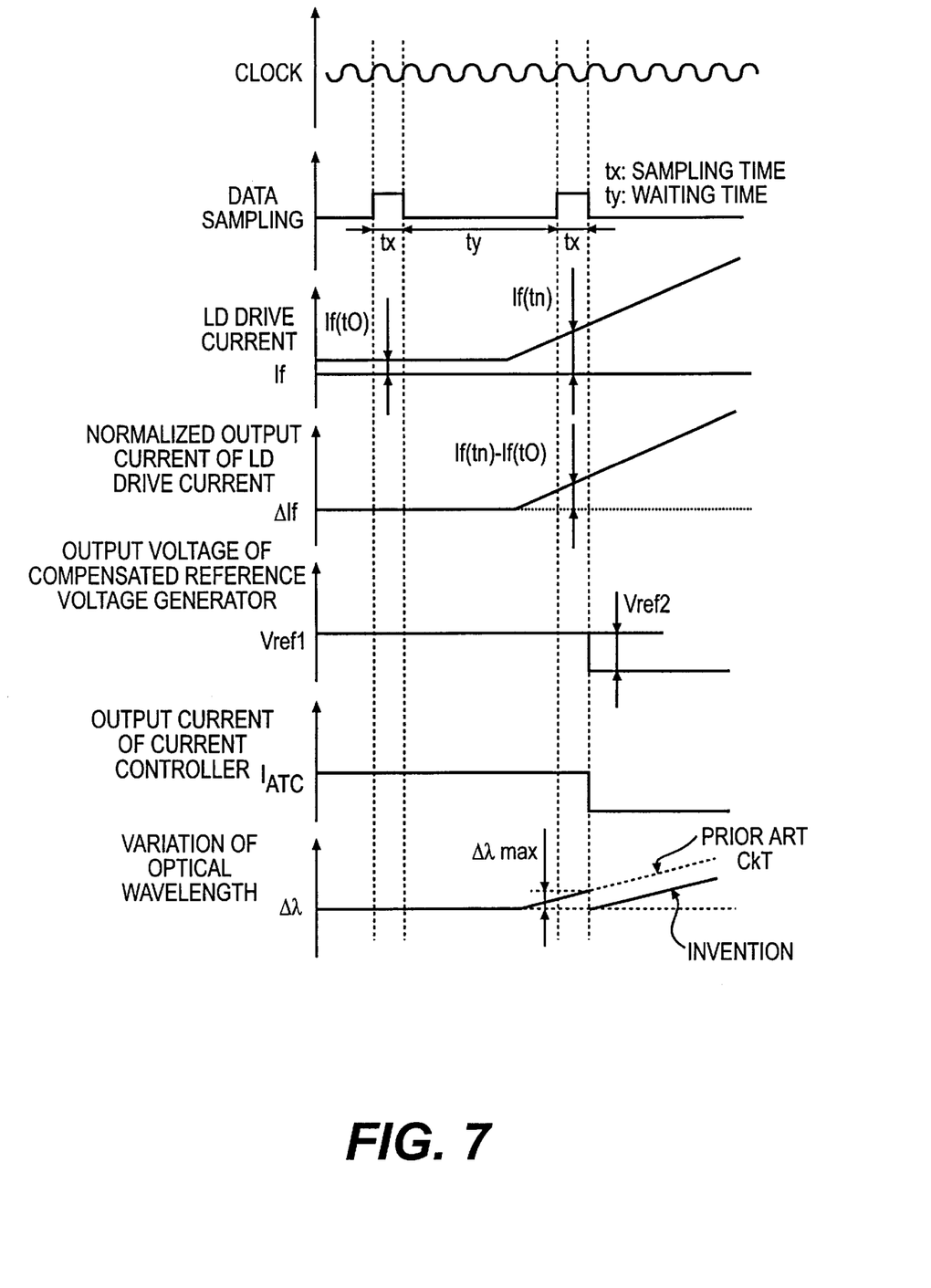
FIG. 7 is a timing chart showing a wavelength drift and an operation in the present invention.

With reference to FIG. 1 and 7, the details for the optical wavelength stability control are described.

An optical wavelength stability control apparatus increases the LD drive current with the APC 7 so as to keep the optical power output constant when the LD 5 deteriorates.

An increased quantity of the LD drive current is detected for every (Tx+Ty) seconds, output as a normalized value, If (tn)−If (t0) via the LD drive current detector 1 and the LD drive current increase/decrease normalization unit 2.

Tx: the sampling time for calculating a mean value of the LD drive current.

Ty: the waiting time. A drive current is sampled by Ty.

If (tn): the mean value of the drive current detected in a sampling time Tx.

If (t0): the initial value of the drive current.

The compensated reference voltage generator 3a calculates a voltage Vref2 to correct an optical wavelength drift share based on the normalized increased value of the drive current and the current-wavelength conversion coefficient α. The voltage generator 3a outputs the compensated reference voltage Vref1−Vref2 to the comparator 8.

The comparator 8 compares the detected temperature of the LD (Vth) with the compensated reference voltage (Vref1−Vref2) and outputs the difference value as a comparison value (Vatc). The comparison value (Vatc) is a temperature setting value.

The current controller 11 controls a current value (Iatc) applied to the thermoelectric cooler 12 to regulate the comparison value (Vatc) to be zero.

The detailed description of the optical wavelength stability control is given by using the following equations.

The wavelength drift quantity $\Delta\lambda'$ in the wavelength stability control apparatus to which the present invention is applied is given by an equation 6 as well as an aforementioned equation 3.

$$\Delta\lambda' = \alpha \cdot \{If(tn) - If(t0)\} + (1/G) \cdot Vatc \cdot \beta \cdot \gamma \quad (6)$$

The feedback stability condition of the control system in the optical wavelength stability control apparatus to which the present invention is applied is given as equation 7.

$$Vatc = G \cdot (Vth - Vref1 + Vref2) \quad (7)$$

where Vref2=the compensated optical wavelength drift voltage (compensated temperature) Now, defining Vref2:

$$Vref2 = -\alpha \cdot \Delta If / (\beta \cdot \gamma) \quad (8)$$

$$= -\alpha \cdot \{If(tn) - If(t0)\} / (\beta \cdot \gamma)$$

The compensated reference voltage generator 3a, shown in FIG. 1, calculates Vref2 according to equation 8.

If equations 7 and 8 are substituted into equation 6, equation 6 can be represented as equation 9.

$$\Delta\lambda' = (Vth - Vref1) \cdot \beta \cdot \gamma \quad (9)$$

If equation 9 is compared with the aforementioned equation 5 that is the wavelength drift share in the conventional method, the wavelength drift share causing the LD drive current increase/decrease of $\alpha \cdot \{If(tn) - If(t0)\}$ can be removed and it is possible to precisely stabilize the optical wavelength.

α, β are specific values of the LD determined for the respective controlled LD. γ is a value determined for the control system and has a different value depending on the control system.

For instance, considering that a Distributed Feedback (DFB) type LD is used where α=0.008 (nm/mA) and β=0.095 nm/° C. and the LD is controlled in a control system where γ=10° C./V. When the LD of initial set drive current If(t0)=60 mA deteriorates and becomes If(tn)=80 mA, Vref 2=−0.168 (V) is obtained from equation 8. Therefore, a correction of an optical wavelength drift can be done by lowering the LD temperature about 1.68° C. down from the initially set temperature. If control is done hourly, the wavelength can be corrected, because it takes more than twenty hours for If(tn)−IF(t0) to reach 10 mA.

The detection of the LD drive current value in the LD drive current detector 1 can be made discretely. By discretely detecting, a control instability factor that two loops exist in the control system can be eliminated.

If the waiting time Ty is long enough, then the stability of a control system can be increased. However, if the time Ty is made long, the maximum drift error of the optical wavelength value Δλmax becomes large.

Thus, as the discrete detection, for instance, a periodical detection can be done by setting a predicted period during which the variation of the drive current requiring a change of setting temperature will occur due to aging of the LD. Alternatively, a dynamic period can be prescribed such that the detection interval is made short in accordance with an increase of the previously detected change in drive current and long in accordance with a decrease of the previously detected change in the drive current.

The discrete sampling of the LD drive current is achieved by synchronizing the compensated reference voltage generator 3a as shown in FIG. 1 with a microcomputer using a clock frequency. By employing this sampling method, the compensated reference voltage generator 3a capable of discretely sampling the LD drive current can be simply configured.

When the LD drive current detector 1 shown in FIG. 1 detects the LD drive current value, a mean value detection can be done at a sampling time Tx. By performing the mean value detection, a deterioration of the precision control caused by sudden noises such as a power surge onto the LD drive current value can be prevented.

Moreover, it is possible to apply the combination of the discrete sampling and the above mean value detection to the present invention. In other words, the LD drive current detector 1 shown in FIG. 1 can detect the LD drive current value discretely and perform the mean value detection at the sampling time Tx. As a result, it is possible to delete two loops causing the control instability factor in the control system and to reduce an influence of the moment noise to the detected LD drive current value. Accordingly, the stability of the control system can be improved.

Based upon the present invention, the LD drive current value driving the LD is detected and the setting temperature can be set in accordance with the fluctuation of the LD drive current value. In other words, it is possible to determine a setting temperature correcting the wavelength drift share due to deterioration caused by aging and maintain the wavelength stability for a long period of time.

Further, the control instability factor caused by two loops existing in the control system can be eliminated by detecting the LD drive current value discretely.

In addition, it is possible to prevent the deterioration of the precision control from affecting the influence of sudden noises, such as a power surge, onto the LD drive current value by performing the mean value detection at the sampling time Tx to detect the LD drive current value.

While the present invention has been described above in conjunction with the preferred embodiments, one of ordinary skill in the art would be enabled by this disclosure to make various modifications to these embodiments and still be within the scope and spirit of the present invention as defined in the appended claims.

What is claimed is:

1. An optical wavelength stability control apparatus for stabilizing an optical wavelength output from a laser diode comprising:
   a current detector which detects a laser diode drive current; and
   a thermal controller which controls a temperature of said laser diode to be a control target value,
   wherein said thermal controller sets said control target value according to said laser diode drive current detected by said current detector.

2. The optical wavelength stability control apparatus according to claim 1, wherein said thermal controller includes a normalization unit which normalizes said laser diode drive current detected by said current detector as a deviation from a predetermined initial value for said laser diode drive current and sets said control target value corresponding to such normalization.

3. The optical wavelength stability control apparatus according to claim 2, wherein said thermal controller includes a compensated reference voltage generator which receives a normalized value from said normalization unit and outputs a temperature setting value.

4. The optical wavelength stability control apparatus according to claim 3, wherein said compensated reference voltage generator also receives a current-wavelength conversion coefficient from a current-wavelength conversion coefficient decider and uses said coefficient in determining said temperature setting value.

5. The optical wavelength stability control apparatus according to claim 1, wherein said current detector detects a laser diode drive current value at a discrete time.

6. The optical wavelength stability control apparatus according to claim 1, wherein said current detector detects a laser diode drive current value hourly.

7. The optical wavelength stability control apparatus according to claim 2, wherein said current detector detects a laser diode drive current value at a discrete time.

8. The optical wavelength stability control apparatus according to claim 1, wherein said current detector has a period setting means for setting a time period for detecting said laser diode drive current value and
   said period setting means sets a shorter time period if a detected increase of said laser diode drive current is large and sets a longer period if a detected increase of said laser diode drive current is small.

9. The optical wavelength stability control apparatus according to claim 2, wherein said current detector has a period setting means for setting a time period to detect said laser diode drive current value and
   said period setting means sets a shorter period if a detected increase of said laser diode drive current is large and sets a longer period if a detected increase of said laser diode drive current is small.

10. The optical wavelength stability control apparatus according to claim 1, wherein said current detector detects a mean value of said laser diode drive current value within a predetermined time.

11. The optical wavelength stability control apparatus according to claim 2, wherein said current detector detects a mean value of said laser diode drive current value within a predetermined time.

12. The optical wavelength stability control apparatus according to claim 1, wherein said optical wavelength stability control apparatus further includes means for monitoring an optical power output by receiving a part of said optical power output from said laser diode and regulating said laser diode drive current so that a monitored optical power output is approximately equal to a predetermined control target value.

13. The optical wavelength stability control apparatus according to claim 2, wherein said optical wavelength stability control apparatus further includes means for monitoring an optical power output by receiving a part of said optical power output from said laser diode and regulating said laser diode drive current so that a monitored optical power output is approximately equal to a predetermined control target value.

14. The optical wavelength stability control apparatus according to claim 3, wherein said optical wavelength stability control apparatus further includes an auto power control circuit which monitors an optical power output by receiving a part of said optical power output from said laser diode and regulating said laser diode drive current so that a monitored optical power output is approximately equal to a predetermined control target value.

15. An optical transmitter including a plurality of laser diode modules, each having a laser diode, a photo diode, and a thermoelectric cooler, the optical transmitter comprising:

an auto power control circuit for controlling stability of an optical power output by varying a laser diode drive current driving said laser diode;

a laser diode drive current detector for detecting a laser diode drive current value;

a laser diode drive current increase/decrease normalization unit for outputting a variation of said laser diode drive current value through normalization based upon a detected laser diode drive current value;

a compensated reference voltage generator for generating a laser diode temperature control target value in response to the normalized variation of the laser diode drive current value;

a temperature monitor circuit for detecting a laser diode temperature value;

a comparator for detecting a difference between said laser diode temperature value and said laser diode temperature control target value; and a current controller for determining a current value to be applied to said thermoelectric cooler to reduce a temperature difference detected by said comparator.

16. The optical transmitter according to claim 15, wherein at least two of said plurality of laser diode modules output light at different wavelengths.

17. An optical multiple wavelength transmitter for transmitting light having a plurality of different wavelengths, said optical multiple wavelength transmitter comprising:

a plurality of laser diodes;

means for detecting respective drive current driving said plurality of laser diodes; and means for controlling respective temperatures of said plurality of laser diodes, wherein said means for controlling includes a temperature detection means for detecting respective temperatures of said plurality of laser diodes, a cooling means for cooling said respective laser diode and a control means for setting a control target temperature for said respective laser diode using a conversion coefficient predetermined for said respective laser diode in response to the variation of the detected drive current and controlling said cooling means to regulate the respective detected temperatures of said laser diodes to a set control target value.

18. The optical multiple wavelength transmitter according to claim 17, wherein at least two of said plurality of laser diodes output light at different wavelengths.

19. A method for stabilizing an optical wavelength output from a laser diode, the method comprising the steps of:

detecting a fluctuation of a drive current driving said laser diode; and regulating a temperature of said laser diode to compensate for said fluctuation of said optical wavelength in accordance with a variation of the laser diode drive current.

20. The method according to claim 19, wherein said step of regulating a temperature of said laser diode includes a step of normalizing a detected laser diode drive current with respect to an initial laser diode drive current and outputting a result of such normalizing to a compensated reference voltage generator.

* * * * *